United States Patent [19]

Shimp

[11] Patent Number: 4,940,848
[45] Date of Patent: Jul. 10, 1990

[54] STABLE SOLUTIONS OF PREPOLYMERS OF THIODI(PHENYLCYANATE) AND LAMINATING METHOD EMPLOYING SAME

[75] Inventor: David A. Shimp, Prospect, Ky.

[73] Assignee: Hi-Tek Polymers, Inc., Jeffersontown, Ky.

[21] Appl. No.: 269,862

[22] Filed: Nov. 10, 1988

Related U.S. Application Data

[63] Continuation-in-part of Ser. No. 45,082, May 4, 1987, abandoned.

[51] Int. Cl.⁵ .................................................. C09J 5/02
[52] U.S. Cl. .............................. 156/307.4; 156/331.2; 427/385.5; 524/104; 524/233; 524/360; 528/211; 528/373; 528/422; 560/301
[58] Field of Search .................. 156/307.4, 331.2; 427/385.5; 524/104, 360, 233; 528/211, 422, 373; 560/301

[56] References Cited

U.S. PATENT DOCUMENTS

| | | | |
|---|---|---|---|
| 3,962,184 | 6/1976 | Notomi et al. | 528/373 |
| 3,987,230 | 10/1976 | Gaku et al. | 156/307.4 |
| 3,994,949 | 11/1976 | Meyer et al. | 560/301 |
| 4,665,154 | 5/1987 | Varnell et al. | 528/211 |

Primary Examiner—John J. Gallagher
Attorney, Agent, or Firm—Herbert P. Price

[57] ABSTRACT

Stable prepolymer solutions are made from partially cyclotrimerized 4,4'-thiodi(phenylcyanate) dissolved in cyclopentanone. The prepolymer solutions are used to make flame retardant and thermally stable laminates.

8 Claims, No Drawings

STABLE SOLUTIONS OF PREPOLYMERS OF THIODI(PHENYLCYANATE) AND LAMINATING METHOD EMPLOYING SAME

CROSS REFERENCE TO RELATED APPLICATIONS

This is a continuation-in-part application of copending Ser. No. 45,082, filed May 4, 1987, now abandoned.

BACKGROUND OF INVENTION

The field of art to which this invention pertains is aryl cyanate esters, i.e., cyanic acid esters of polyhydric phenols.

Industry is constantly searching for lighter, stronger and more resistant materials to be used in place of the materials used today. Structural and electrical grade composites made from thermoset or thermoplastic resins and glass or carbon fibers have been and are being used successfully in many applications. However, improved flame retardant and thermally stable compositions are being sought for printed circuit board applications and for structural composites used in aircraft cabins, such as honeycomb panels, floor beams, seats and the like. Composites made with brominated epoxy resins are flame retardant but lack thermal stability. One deficiency of halogenated flame retardant systems is delamination or conductor disbondment in printed circuit boards subjected to field-soldering operations where solder gun contact can elevate board temperature to 350° C. A second deficiency in the use of halogenated resin systems is the generation of toxic, halogenated degradation by-products during fire exposure.

The use of laminates made with polyimides, e.g., adducts of bismaleimides and methylene dianiline, overcomes the above-stated disadvantages of using halogenated epoxy resins. However, polyimides have problems associated with high moisture absorption, brittleness, toxicity of unreacted aromatic diamines and poor storage stability of the resin solutions.

Cyanate esters of polyhydric phenols are finding increasing uses in many structural and electrical applications. Composites based on cured cyanate esters have many excellent properties, such as low moisture absorption, good heat stability and high tensile and flexural strengths.

Cyanate esters made from the reaction of a cyanogen halide and a variety of polyhydric phenols are disclosed in U.S. Pat. Nos. 3,562,214 and No. 4,060,541. Prepolymers of dicyanate esters of dihydric phenols are disclosed in British Patent No. 1,305,762. In U.S. Pat. Nos. 4,223,073 and 4,254,012, prepregs, composites and laminates based on cyanate esters of polyhydric phenols are described.

In U.S. Pat. No. 4,430,485, flame retardant polycarbonate and copolyestercarbonate compositions are described. Such compositions are made by incorporating sulfur-containing diphenols in the polycarbonate structures.

SUMMARY OF INVENTION

This invention is directed to solutions of prepolymers of cyanate esters of dihydric phenols. In one aspect, this invention relates to stable solutions of prepolymers of cyanate esters of 4,4'-thiodiphenol. In another aspect, this invention pertains to stable solutions of prepolymers of cyanate esters of 4,4'-thiodiphenol which can be used to make flame retardant composites, laminates, adhesives and coatings.

The compositions of this invention are stable solutions of prepolymers of thiodi(phenylcyanate) in a solvent which is cyclopentanone wherein the prepolymers have about 20 to about 65 percent of the cyanate groups cyclotrimerized. Flame retardant structural composites, electrical grade laminates and bonding plies for multilayer printed circuit boards are made from these prepolymer solutions by forming prepregs of the prepolymers and fibers and fabrics made from glass, carbon, quartz, polyarylates and aromatic polyamides/polyimides. Adhesive coatings for metal foil conductors are applied by doctor blade or roll coating the prepolymer solutions followed by solvent removal in drying ovens or towers.

DETAILES OF INVENTION

The dicyanate esters used in this invention are made by reacting 4,4'-thiodiphenol with a cyanogen halide in the presence of an acid acceptor, i.e., a base. This reaction is well known and is described in U.S. Pat. No. 3,755,402 which is hereby incorporated by reference.

The acid acceptors which can be used to prepare the 4,4'-thiodi(phenylcyanate) are inorganic or organic bases, such as sodium hydroxide, potassium hydroxide, sodium methylate, potassium methylate and various amines, preferably tertiary amines. Examples of useful amines are triethylamine, trimethylamine, tripropylamine, diethylpropylamine, pyridine and the like. A preferred base is triethylamine.

The reaction of the cyanogen halide and the dihydric phenol is carried out in an organic solvent, such as ethyl acetate, toluene, xylene, chlorinated hydrocarbons, acetone, diethyl ketone and the like. A preferred solvent is methylene chloride. The reaction is conducted at low temperatures, preferably between about $-30°$ C. and $15°$ C.

4,4'-Thiodi(phenylcyanate) is prepolymerized by cyclotrimerizing part of the cyanate ester groups. The prepolymers are made by heating the dicyanate ester with or without catalysts at a temperature of about 100° C. to about 240° C. for a time sufficient to cyclotrimerize about 20 to about 65 percent of the cyanate functional groups and, preferably, about 30 to about 60 percent. Catalysts which can be used in preparing the prepolymers are mineral or Lewis acids, bases such as alkali metal hydroxides, alkali metal alcoholates or tertiary amines, salts such as sodium carbonate or lithium chloride, or active hydrogen containing compounds, such as bisphenols and monophenols. It is preferred to conduct the prepolymerization reaction without a catalyst utilizing only heat followed by thermal quenching in the manner taught in British Patent No. 1,305,762 which is hereby incorporated by reference.

Cyanate ester content can be determined quantitatively by infrared analysis or by "residual heat of reaction" using a differential scanning calorimeter. The percent trimerization is calculated by the formula:

$$\text{Percent Trimerization} = 100 - \left[ \frac{Wt/OCN \text{ Monomer}}{Wt/OCN \text{ Prepolymer}} \times 100 \right]$$

wherein Wt/OCN is the equivalent weight per cyanate group.

Refractive index is directly related to the percent trimerization. A plot of refractive indices, taken at the same temperature, versus percent trimerization is linear. The slope of the plotted line will vary with the chemical composition of the particular cyanate ester being prepolymerized and the prism temperature. By using the plot, the refractive index can be used to monitor the rate of reaction and the extent of the cyclotrimerization reaction.

The prepolymer solutions of this invention are made by dissolving the prepolymer in the solvent at a solids content of about 25 to about 90 weight percent. The solids content is adjusted to give a solution viscosity of about 30 to about 5,000 cps. The preferred solids content is about 40 to about 80 weight percent.

The solvent used to form the solutions of this invention is cyclopentanone. Solutions of prepolymers of 4,4'-thiodi(phenylcyanate) in cyclopentanone are stable for all seasons storage and shipping. When used to form prepregs, the cyclopentanone solvent is readily removed in the drying process. Minor amounts of other solvents can be used in admixture with cyclopentanone. However, if less than 50 weight percent cyclopentanone is used, the solutions will increase in viscosity, will solidify, will precipitate from solution forming hazy or white dispersions, or the solvents are difficult to remove from prepregs. The fact that stable solutions of 4,4'-thiodi(phenylcyanate) prepolymers can only be prepared with cyclopentanone is surprising since stable solutions of prepolymers of other cyanate esters, e.g., dicyanate esters made from Bisphenol A and bis(4-hydroxy-3,5-dimethylphenyl) methane, can be made from commonly used prepreg solvents, e.g., methyl ethyl ketone and acetone.

Prepregs are formed from the prepolymer solutions of this invention and fibers and fabrics made from glass, carbon, quartz, polyarylates, aromatic polyamides/polyimides, paper, metal filaments and the like. Such prepregs are made by contacting the fiber or fabric with the prepolymer solution and then evaporating the solvent to solidify the resin on the fiber or fabric. This process can be conducted manually by dipping, striking off excess solution and drying in a forced air oven, or in a continuous manner by immersing the tensioned fabric or tow in the prepolymer solutions using conventional treaters with squeeze rollers and vertical drying towers.

Drying is conducted at a temperature range of about 220° F. to about 375° F. for a time, generally about 1 minute to about 20 minutes, sufficient to lower the solvent content in the prepreg to below about 5 weight percent basis.

After drying, stiff (boardy) prepregs can be stored at room temperature; tacky, drapable prepregs can be stored at 32° F. or below for periods of up to 12 months without advancing too far in cure.

Prior to forming the prepregs, curing catalysts are added to the prepolymer solutions. Such curing catalysts include those described hereinbefore which can be used to prepare prepolymers. Additional catalysts are those described in U.S. Pat. Nos. 3,962,184, 3,694,410 and 4,026,213 and 4,608,434 which are hereby incorporated by reference. Examples of such catalysts include zinc octoate, manganese octoate, zinc stearate, tin stearate, copper acetylacetonate, phenol, catechol, triethylenediamine and chelates of iron, cobalt, zinc, copper, manganese and titanium with bidentate ligands, such as catechol. Such catalysts are used in the amounts of about 0.001 to about 20 parts by weight per 100 parts by weight of prepolymer. A preferred catalyst system is that described in U.S. Pat. No. 4,604,452 which is hereby incorporated by reference. Such catalysts are liquid solutions of a metal carboxylate and an alkylphenol, e.g., copper naphthenate and nonylphenol. These catalysts are used in the amounts of about 0.001 to about 0.5 part by weight of metal and about 1 to about 20 parts by weight of alkylphenol per 100 parts by weight of prepolymer.

The prepreg fabrics and tapes are formed into cured laminates using conventional procedures such as press molding under platen pressure or bag molding under vacuum in a gas-pressured autoclave.

The prepolymer solutions of this invention can also be used by filament winding prepreg fiber tows or tapes, and by bonding coated conductor foil or adhesive interplies in laminate fabrication processes.

The cyanate ester prepregs are cured in the molding operations by being heated at elevated temperatures for a time to achieve a useful degree of conversion (or cure), i.e., until at least about 80 percent of the cyanate functional groups originally present in the cyanate ester are cyclotrimerized. The curing reaction can be conducted at one temperature or can be conducted by heating in steps. If conducted at one temperature, the temperature will vary from about 250° F. to about 450° F. When conducted by stepwise heating, the first step, or gelation step, is performed at a temperature of about 150° F. to about 350° F. The curing step is conducted at a temperature of about 300° F. to about 400° F. and the optional post-curing step is conducted at a temperature of about 400° F. to about 550° F. The overall curing reaction takes about 5 minutes to about 8 hours.

Laminates prepared from the thiodi(phenylcyanates) exhibit low moisture absorption, low dielectric constant, high copper peel strength, flame retardancy, thermal stability and toughness.

The following examples describe the invention in greater detail. Parts and percentages unless otherwise designated are parts and percentages by weight.

EXAMPLE 1

To a suitable reactor were added 1050 parts of methylene chloride. Cyanogen chloride gas, 202.8 parts, was added by means of a sparge over a period of 1 hour and 23 minutes while keeping the temperature between 1.5° and 7.2° C. The temperature was lowered to 4° C. and a solution of 359.9 parts of 4,4'-thiodiphenol in 360 parts of acetone was added over 18 minutes with the temperature rising to 8° C. The temperature was then lowered to −10° C. and 329.8 parts of triethylamine were added over a period of 56 minutes with the temperature being controlled between −10° C. and −8° C. During the addition, 600 parts of acetone were added to reduce the viscosity of the reacting mixture. The product in methylene chloride solution was washed with 1800 parts of water. The washing was repeated 3 more times. When the washing was completed, vacuum and heat were applied to remove the methylene chloride to a concentration of 70 percent non-volatiles. The solution was chilled to 40° F., and the precipitated crystals were removed by filtration. After drying under vacuum, the yield of 4,4'-thiodi(phenylcyanate) was 352.2 parts. The purity, determined by Differential Scanning Calorimeter was 98.9 percent. The melting point was 93.7° C.

EXAMPLE 2

To a suitable reactor were added 600 parts of 4,4'-thiodi(phenylcyanate). Heat, agitation and a nitrogen sparge were applied. The temperature was raised to 116° C. at which point, the crystalline cyanate ester was fully melted. The rate and extent of the cyclotrimerization reaction were determined by measuring the refractive index (R.I) at 100° C. The initial refractive index, the fully melted material, was 1.5852. The temperature was raised to 165° C. and the reaction was continued for 5 hours. The refractive index was 1.6156 at the end of this period, which indicated 29.3 percent trimerization. After an additional 30 minutes heating at 165° C., the R.I. was 1.6186 indicating 31.6 percent trimerization. Heating was discontinued, allowing the temperature to reach room temperature and remain at room temperature overnight. Heating was resumed to raise the temperature to 165° C. At this point, the RI was 1.6262 which indicated 37.8 percent trimerization. After 90 minutes additional heating at 165° C. the R.I. was 1.6340 and the percent trimerization was 44.2 percent. Fifty minutes later, the temperature had been decreased to 160° C. The R.I was 1.6383 and the percent trimerization was 48.6 percent. After 20 minutes additional heating at 160° C., the R.I was 1.6405, the percent trimerization was 51.4 percent, and the physical appearance of a prepolymer sample cooled to room temperature was an amorphous, amber colored hard resin.

EXAMPLE 3

A solution was made from 55 parts of the prepolymer of 4,4'-thiodi(phenylcyanate) and 45 parts of cyclopentanone. Two viscosity tubes were filled with the solution. One tube was kept at 77° F., the other at 40° F. The Gardner-Holdt viscosity at 25° C. was determined periodically and the solutions were checked for signs of thickening, separation or other instability. The initial viscosity was G and the solution was clear. After 6 days at 77° F., the viscosity was G-H and the solution was clear. After 3 weeks at 77° F., the solution was still clear and the viscosity was still G-H. The viscosity of the solution kept at 40° F. was G-H after 9 days and remained at G-H after 3 weeks.

EXAMPLE 4

Additional solutions were made with the 4,4'-thiodi(phenylcyanate) prepolymer and other solvents or mixtures of solvents at 55 percent solids. The stability of the solutions was determined using the procedure described in Example 3. The solvents, the appearance of the solutions and viscosity data (Gardner-Holdt) are listed in Table I.

TABLE I

| Solvent | Days at 77° F. | | | | | | Days at 40° F. | | |
|---|---|---|---|---|---|---|---|---|---|
| | Initial | 1 | 3 | 11 | 25 | 31 | 1 | 3 | 11 |
| Dimethylformamide 50% Cyclohexanone 50% | Clear H | Clear H | Clear H-I | Clear I-J | Clear I-J | Clear I-J | Clear OK | Clear OK | Clear >Z7 |
| Dimethylformamide 50% Nitromethane 50% | Clear B | Clear B | Clear D | Cloudy >Z7 | | | Hazy >Z7 | | |
| Dimethylformamide 50% Acetonitrile 50% | Clear A | Clear A | Hazy >Z7 | | | | White >Z7 | | |
| Dimethylformamide 50% Acetone 50% | Clear B | Clear B | Clear B | Cloudy >Z7 | | | Hazy >Z7 | | |
| N-Methylpyrrolidone 50% Acetone 50% | Clear A | Clear A | Clear A | Clear A | | >Z7 | Hazy OK | Clear OK | White >Z7 |
| N-Methylpyrrolidone 50% Cyclohexanone 50% | Clear O | Clear O | Clear O-P | Clear P | Clear Q | Clear R | Clear OK | Clear OK | Clear >Z7 |
| Cyclohexanone 50% Nitromethane 50% | Clear E | Clear E | Clear F | Hazy >Z7 | | | Clear OK | Hazy >Z7 | |
| Cyclohexanone 50% Acetonitrile 50% | Clear A | Clear A | Clear A | Cloudy >Z7 | | | Clear OK | White >Z7 | |
| Dimethylformamide | Clear D | | | | | D | Clear OK | Clear OK | Clear OK |
| N-Methyl pyrrolidone | Clear J | | Clear J-K | Clear L | Clear M | Clear N | Clear OK | Clear OK | Clear OK |

EXAMPLE 5

More solutions were made with the prepolymer of 4,4'-thiodi(phenylcyanate) and solvents or solvent mixtures at 65 percent solids. The solvents and viscosity data are listed in Table II.

TABLE II

| Solvent | Days at 40° F. | | | Days at 77° F. | | |
|---|---|---|---|---|---|---|
| | Initial | 1 | 7 | 3 | 7 | 21 |
| Cyclohexanone | Clear Z2 | Cloudy Stiff | | Clear Solid | | |
| Cyclohexanone 50% | Clear | Clear | Hazy | Clear | Clear | Clear |

TABLE II-continued

| Solvent | Days at 40° F. | | | Days at 77° F. | | |
|---|---|---|---|---|---|---|
| | Initial | 1 | 7 | 3 | 7 | 21 |
| N-Methyl-pyrrolidone 50% | Y-Z | | Stiff | OK | OK | OK |
| Cyclohexanone 50% Nitromethane 50% | Clear L | Cloudy Stiff | | Clear OK | Hazy Solid | |
| Cyclohexanone 50% t-Butanol 50% | White >Z7 | White Stiff | | White Stiff | | |
| Cyclohexanone 50% Acetonitrile 50% | Clear K | Cloudy Stiff | | Clear OK | Cloudy Stiff | |
| Cyclohexanone 50% Isopropanol 50% | White >Z7 | White Stiff | | White Stiff | | |
| Acetonitrile | White K | White Stiff | | White Stiff | | |
| Acetonitrile 50% N-Methyl-pyrrolidone 50% | Clear J | Cloudy Stiff | | Clear OK | Hazy Solid | |
| Acetonitrile 50% t-Butanol 50% | White >Z7 | White Stiff | | White Stiff | | |
| Acetonitrile 50% Diacetone Alcohol 50% | Clear O | White Stiff | | White Stiff | | |
| Acetone 50% N-Methyl-pyrrolidone 50% | Clear S | Hazy Flows | White Stiff | Clear OK | Hazy Liquid | |
| Nitromethane 50% Acetonitrile 50% | Clear G | White Stiff | | Hazy Stiff | | |
| Nitromethane 50% Isopropanol 50% | White | White Stiff | | White Stiff | | |
| Nitromethane 50% N-Methyl-pyrrolidone 50% | Clear V | Hazy Stiff | Cloudy Stiff | Clear OK | Hazy Stiff | |

EXAMPLE 6

To 10,365 parts of a prepolymer solution in cyclopentanone containing 5797 parts of a prepolymer of 4,4'-thiodi(phenylcyanate) having an R.I. at 110° C. of 1.6374 were added 0.754 part of a solution at 40 percent solids of manganese octoate in mineral spirits and 115.8 parts of a solution at 50 percent solids of Bisphenol A in methyl ethyl ketone. Prepregs were made by saturating glass cloth with the catalyzed prepolymer solution and the resin was "B" staged by heating in a treater tower at 283° F. in Zone 1 and at 355° F. in Zone 2 for a total heating time of 5 minutes.

Eight ply laminates were made from the prepregs using a press at 112 psi. The press was heated from 80° F. to 230° F. at a rate of 15 per minute and was held at 230° F. for 10 minutes. The temperature was then raised to 350° F. at 15 per minute and was held at 350° F. for 60 minutes. The laminates were then post cured for 5 hours at 437° F. The resin content of the laminates was 38.1 percent and the thickness was 0.057 inch. The physical properties of the laminates are listed in Table III.

EXAMPLE 7

Using the same procedure described in Example 6, a prepreg varnish was made from 10,660 parts of a prepolymer solution in cyclopentanone of 5962 parts of the prepolymer of Example 6, 0.775 part of a solution at 40 percent solids of manganese octoate in mineral spirits and 119 parts of a solution at 50 percent solids of Bisphenol A in methyl ethyl ketone. The stability of the varnish was determined by measuring the viscosity (Gardner-Holdt) at one day intervals and by determining the time in seconds for the varnish to gel when heated at 340° F. again at one day intervals.

| Days | Viscosity | Seconds to gel at 340° F. |
|---|---|---|
| 0 | E-F | 222 |
| 1 | F | 214 |
| 2 | F | 219 |
| 3 | F | 218 |
| 4 | F | 212 |
| 6 | F | 218 |

Prepregs were made from the varnish solution by saturating glass cloth with the solution followed by "B" staging by heating in a treater tower at 281° F. in Zone 1 and at 338° F. in Zone 2 for a total heating time of 5 minutes.

Eight ply laminates were made from the prepregs using a press at 85 psi. The press was heated from 80° F. to 230° F. at a rate of 15° per minute and was held at 230° F. for 20 minutes. The temperature was then raised to 350° F. at 15° per minute and was held at 350° F. for 60 minutes. The laminates were post cured for 5 hours at 437° F.. The resin content of the laminates was 19.0 percent and the laminate thickness was 0.048 in. The physical properties of the laminates are listed in Table III.

TABLE II

| | Physical Properties of Cured Laminates | |
|---|---|---|
| Properties | Example 6 | Example 7 |
| Tg °C. | 242 | 238 |
| Flammability (UL-94) | VO | VO |
| Dielectric Constant | | |
| Room Temperature (RT) | 4.41 | 4.74 |
| After 48 hours in 50° C. water | 4.60 | 4.98 |
| Dissipation Factor | | |
| After 48 hours in 50° C. water | 0.0026 | .0015 |
| Peel Strength* lbs/in width | | |
| 25° C. | 13.9 | 14.3 |
| 100° C. | 12.4 | 13.5 |
| 200° C. | 10.1 | 11.0 |

TABLE II-continued

| Physical Properties of Cured Laminates | | |
|---|---|---|
| Properties | Example 6 | Example 7 |
| Flexure Length wise at RT | | |
| Ultimate (psi) | 80,267 | 88,008 |
| Initial Modulus ($10^6$) | 3.0 | 3.85 |
| at 150° C. | | |
| Ultimate | 75,229 | 81,784 |
| Initial Modulus ($10^6$) | 3.4 | 3.75 |
| Crosswise at Room Temperature | | |
| Ultimate (psi) | 51,896 | 60,377 |
| Initial Modulus ($10^6$) | 2.6 | 3.25 |
| at 150° C. | | |
| Ultimate (psi) | 49,926 | 48,879 |
| Initial Modulus ($10^6$) | 2.9 | 3.05 |

*Clad with 1 oz. copper-foil.

EXAMPLE 8

To 1500 parts of a prepolymer solution in dimethylformamide (DMF) containing 825 parts of a prepolymer of 4,4'-thiodi(phenylcyanate) having an R.I at 110° C. of 1.6450 were added 0.233 part of a solution at 40 percent solids of manganese octoate in mineral spirits. The gel time of the prepolymer varnish was found to be 167 seconds at 340° F. Prepregs were made by saturating glass cloth with the catalyzed prepolymer solution and the resin was "B" staged by heating at 290° F. for 4 minutes. The resin content of the fiber glass prepreg was 50 percent and the volatile content ranged from 1.0 to 1.5 percent.

Eight ply laminates were made from the prepregs using a press at 89 psig. The press was heated from 77° F. to 230° F. at a rate of 15° per minute and was held at 230° F. for 20 minutes. The temperature was then raised to 350° F. at 15° per minute and was held for 60 minutes at 350° F. Part of the laminates were then post cured for 1 hour at 420° F., 2 hours at 450° F. and 4 hours at 480° F. The Tg after each post curing period was 233° C., 234° C. and 240° C.

The remaining laminates were stored at 25° C. for 1.5 months and were post cured at 450° F. for 2 hours. Base and copper clad laminates made from this DMF laminating solution blistered and delaminated badly on post curing indicating residual dimethylformamide in the laminate.

EXAMPLE 9

Using the same procedure described in Example 6, a varnish was prepared from 10,000 parts of a solution in N-methylpyrrolidone of a prepolymer of 4,4-thiodi(phenylcyanate) at 55.32 percent solids, 2.2 parts of a solution at 40 percent solids of cobalt naphthenate in mineral spirits. Prepregs were made by saturating glass cloth with the varnish and the resin was "B" staged in the prepreg treater, using infra red heat in the first zone and a temperature of 318° F. in the second zone. The total heating time was about 5 minutes. The prepregs were rubbery, not stiff and boardy, and were difficult to handle This was attributed to residual N-methylpyrrolidone solvent in the prepreg.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit and scope of the invention.

I claim:

1. A stable solution of a prepolymer of thiodi(phenylcyanate) comprising:
   (A) a prepolymer of thiodi(phenylcyanate) wherein about 20 to about 65 percent of the cyanate groups are cyclotrimerized; and
   (B) as a solvent, cyclopentanone, wherein about 25 to about 90 weight percent of the prepolymer is present in the total weight of the solution.

2. The solution of claim 1 wherein about 40 to about 80 weight percent of the prepolymer is present in the total weight of the solution.

3. The solution of claim 2 wherein the viscosity at 25° C. is about 30 to about 5,000 centipoise.

4. The solution of claim 1 wherein about 30 to about 60 percent of the cyanate groups are cyclotrimerized 5. In a process for preparing flame retardant laminates by the steps of:
   (a) impregnating fibers with a solution of a prepolymer of a polycyanate ester;
   (b) heating the impregnated fibers to remove solvent and to "B" stage the prepolymer, and;
   (c) heating under pressure one or more plies of the "B" staged impregnated fibers to cure the prepolymer, the improvement which comprises using a solution of a prepolymer of thiodi(phenylcyanate) in cyclopentanone solvent wherein the cyanate groups in the prepolymer are about 20 to about 65 percent trimerized and wherein about 25 to about 90 weight percent of the prepolymer is present in the total weight of the solution.

6. The process of claim 5 wherein the prepolymer solution contains about 40 to about 80 weight percent of the prepolymer wherein said weight percent is based on the total weight of the solution.

7. The process of claim 5 wherein the viscosity of the prepolymer solution is about 30 to about 5,000 centipoise.

8. The process of claim 5 wherein about 30 to about 60 percent of the cyanate groups are cyclotrimerized.

* * * * *